(12) United States Patent
Augendre et al.

(10) Patent No.: US 11,226,382 B2
(45) Date of Patent: Jan. 18, 2022

(54) CURRENT SENSOR SYSTEM

(71) Applicant: Allegro MicroSystems, LLC, Manchester, NH (US)

(72) Inventors: David Augendre, Menthonnex en Bornes (FR); Yannick Vuillermet, Voglans (FR)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 16/841,853

(22) Filed: Apr. 7, 2020

(65) Prior Publication Data

US 2021/0311136 A1  Oct. 7, 2021

(51) Int. Cl.
| | |
|---|---|
| *G01R 19/00* | (2006.01) |
| *G01R 33/07* | (2006.01) |
| *G01R 15/20* | (2006.01) |
| *G01R 33/09* | (2006.01) |

(52) U.S. Cl.
CPC ......... *G01R 33/072* (2013.01); *G01R 15/202* (2013.01); *G01R 15/207* (2013.01); *G01R 19/0092* (2013.01); *G01R 33/09* (2013.01)

(58) Field of Classification Search
CPC .... G01R 33/072; G01R 33/09; G01R 15/202; G01R 15/207; G01R 19/0092
See application file for complete search history.

(56) References Cited

U.S. PATENT DOCUMENTS

| | | |
|---|---|---|
| 4,757,420 A | 7/1988 | Saletta et al. |
| 6,300,617 B1 | 10/2001 | Daughton et al. |
| 6,583,613 B1 | 6/2003 | Hohe et al. |
| 7,476,816 B2 | 1/2009 | Doogue et al. |
| 7,746,056 B2 | 6/2010 | Stauth et al. |
| 7,816,905 B2 | 10/2010 | Doogue et al. |
| 7,923,996 B2 | 4/2011 | Doogue et al. |
| 7,936,164 B2 | 5/2011 | Doogue et al. |
| 8,030,918 B2 | 10/2011 | Doogue et al. |
| 8,447,556 B2 | 5/2013 | Friedrich et al. |

(Continued)

FOREIGN PATENT DOCUMENTS

| | | |
|---|---|---|
| GB | 2547732 | 8/2017 |
| WO | WO 2017/144715 A1 | 8/2017 |

OTHER PUBLICATIONS

Melexis Inspired Engineering; "Current Sensors Reference Design Guide"; Aug. 2016; 27 Pages.

(Continued)

*Primary Examiner* — Dominic E Hawkins
(74) *Attorney, Agent, or Firm* — Daly, Crowley, Mofford & Durkee, LLP

(57) ABSTRACT

A current sensor system includes a plurality of conductors, each having a first major surface, a second major surface opposite the first major surface, and an aperture extending from the first major surface through a thickness of the conductor to the second major surface. Each of the plurality of conductors is configured to carry a current and wherein the apertures of each of the plurality of conductors are aligned with a common reference line. The current sensor system further includes a plurality of current sensors, each positioned at least partially in the aperture of a respective conductor and including one or more magnetic field sensing elements.

30 Claims, 8 Drawing Sheets

(56) References Cited

U.S. PATENT DOCUMENTS

| | | |
|---|---|---|
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,818,749 B2 | 8/2014 | Friedrich et al. |
| 8,896,295 B2 | 11/2014 | Friedrich et al. |
| 8,907,669 B2 | 12/2014 | Petrie |
| 9,081,041 B2 | 7/2015 | Friedrich et al. |
| 9,151,807 B2 | 10/2015 | Friedrich et al. |
| 9,201,122 B2 | 12/2015 | Cesaretti et al. |
| 10,481,181 B2 | 11/2019 | Bussing et al. |
| 2007/0279053 A1 | 12/2007 | Taylor et al. |
| 2009/0121704 A1* | 5/2009 | Shibahara ............ G01R 15/202 324/117 R |
| 2012/0001617 A1 | 1/2012 | Reynolds |
| 2012/0253726 A1 | 10/2012 | Xu |
| 2013/0015843 A1 | 1/2013 | Doogue et al. |
| 2013/0335076 A1* | 12/2013 | Sakamoto ............ G01R 15/207 324/244 |
| 2014/0266181 A1 | 9/2014 | Milano et al. |
| 2014/0312883 A1 | 10/2014 | Friedrich et al. |
| 2015/0301149 A1 | 10/2015 | Cesaretti et al. |
| 2015/0331079 A1 | 11/2015 | Kolwalker et al. |
| 2015/0338444 A1 | 11/2015 | Ivanov et al. |
| 2015/0362532 A1 | 12/2015 | Chartouni |
| 2016/0011239 A1 | 1/2016 | Yoon et al. |
| 2016/0274060 A1 | 9/2016 | Deneneberg et al. |
| 2017/0285075 A1* | 10/2017 | Okuyama ............ G01R 15/205 |
| 2018/0238938 A1* | 8/2018 | Feucht ............... G01R 33/0082 |
| 2018/0321283 A1* | 11/2018 | Sei ............................ H01F 3/14 |
| 2019/0391185 A1 | 12/2019 | El Bacha et al. |
| 2020/0057097 A1 | 2/2020 | Vuillermet et al. |
| 2020/0057120 A1 | 2/2020 | Belin et al. |
| 2021/0080489 A1* | 3/2021 | Koizumi ................ G01D 5/145 |

OTHER PUBLICATIONS

Allegro MicroSystems datasheet "ACS37612 Coreless, High Precision, Hall-Effect Current Sensor IC with Common-Mode Field Rejection and High Bandwidth (240 kHz)", Mar. 9, 2020, 22 pages.

Auto Innovations "L'évolution du moteur électrique passe par une meilleure mesure de la position de son rotor", Oct. 2019, 7 pages.

Extended European Search Report dated Jul. 10, 2018 for EP Application No. 18154879.3; 10 Pages.

Response filed on Feb. 22, 2019 for European Application No. 18154879.3; 20 Pages.

Intention to Grant dated Jun. 7, 2019 for European Application No. 18154879.3; 7 Pages.

Office Action dated Sep. 24, 2019 for U.S. Appl. No. 15/435,725; 25 pages.

Response to Office Action filed on Oct. 18, 2019 for U.S. Appl. No. 15/435,725; 13 pages.

Final Office Action dated Jan. 24, 2020 for U.S. Appl. No. 15/435,725; 25 pages.

Response to Final Office Action and Request for Continued Examination (RCE) filed on Mar. 31, 2020 for U.S. Appl. No. 15/435,725; 14 pages.

Notice of Allowance dated Jun. 9, 2020 for U.S. Appl. No. 15/435,725; 8 pages.

Office Action dated Jul. 6, 2020 for U.S. Appl. No. 15/999,122; 18 pages.

\* cited by examiner

CURRENT SENSOR SYSTEM

CROSS REFERENCE TO RELATED APPLICATIONS

Not Applicable.

STATEMENT REGARDING FEDERALLY SPONSORED RESEARCH

Not Applicable.

FIELD

The present disclosure relates generally to current sensor systems with multiple conductors and magnetic field current sensors.

BACKGROUND

Some conventional electrical current sensors are positioned near a current-carrying conductor to sense a magnetic field generated by the current through the conductor. The current sensor generates an output signal having a magnitude proportional to the magnetic field induced by the current through the conductor.

Some conventional current sensors employ a ferrite or other magnetic core positioned around the conductor, in order to concentrate the magnetic field in the vicinity of the sensor. Such a core may provide some level of shielding against stray fields, such as those that may be caused by currents flowing in adjacent conductors.

Accurately measuring an intended current through a conductor can be more challenging in systems including multiple conductors. These challenges can be compounded by application constraints such as mechanical tolerances, sensor misplacements, temperature variations, high current range, AC current, available space, crosstalk, etc.

SUMMARY

Systems and methods described herein are directed towards current sensor systems in which multiple conductors carry currents for detection by respective current sensors. Challenges in conventional such configurations that are addressed by the disclosure include reducing mechanical tolerances due to repeatable, tightly controllable positioning of the current sensors with respect to the conductors and reducing the effects of crosstalk (i.e., magnetic fields generated by current through a conductor being unintentionally detected by a current sensor) and of stray magnetic fields, thereby improving current detection performance. Additionally, the disclosure presents a more compact current sensor system than heretofore provided.

According to the disclosure, a current sensor system includes a plurality of conductors, each having a first major surface, a second major surface opposite the first major surface, and an aperture extending from the first major surface through a thickness of the conductor to the second major surface, wherein each of the plurality of conductors is configured to carry a current. The apertures of each of the plurality of conductors are aligned with a common reference line. The system further includes a plurality of current sensors, each positioned at least partially in the aperture of a respective conductor and including one or more magnetic field sensing elements.

The current sensor system may include one or more of the following features alone or in combination. Each current sensor may include at least two magnetic field sensing elements, each configured to generate a respective magnetic field signal indicative of a detected magnetic field and a circuit responsive to the magnetic field signals from the at least two magnetic field sensing elements and configured to generate a current sensor output signal including a difference between the magnetic field signals from the at least two magnetic field sensing elements and indicative of the current carried by the respective conductor. The conductors may take the form of bus bars. The current sensors may be mounted on a substrate such as a printed circuit board. The current sensors may be mounted on the same printed circuit board. In embodiments, the printed circuit board may extend through the aperture of each of the plurality of conductors. The printed circuit board may be T-shaped, wherein a first portion of the T-shaped printed circuit board extends through the aperture of each of the plurality of conductors. A second portion of the T-shaped printed circuit board orthogonal to the first portion may abut a major surface of a conductor. The magnetic field sensing elements may include one or more magnetoresistance elements or Hall effect elements. In embodiments, for each current sensor, the circuit is configured to determine a coupling factor indicative of a magnetic coupling between the current sensor and each of the plurality of conductors and to use the coupling factors to determine the current in one or more of the plurality of conductors. In embodiments, the current sensor system may include one or more additional conductors, each having a first major surface, a second major surface opposite the first major surface, and an aperture extending from the first major surface through a thickness of the conductor to the second major surface, wherein each of the one or more additional conductors is configured to carry a current and wherein the apertures of each of the one or more additional conductors are not aligned with the common reference line.

Also described is a method for determining a current in a plurality of conductors including providing a plurality of current sensors, each including one or more magnetic field sensing elements configured to generate a respective magnetic field signal indicative of a detected magnetic field, providing a plurality of conductors, each configured to carry a current to be measured and having an aperture extending from a first major surface of the conductor through a thickness of the conductor to a second, opposite major surface of the conductor, and positioning the plurality of conductors relative to each other so that the aperture of each conductor is aligned with a common reference line. The method further includes providing a printed circuit board extending through the aperture of each of the conductors along the common reference line, wherein each of the plurality of current sensors is mounted on the printed circuit board and positioned at least partially within the aperture of a respective conductor.

The method may include one or more of the following features alone or in combination. Providing the plurality of current sensors may include providing each current sensor with at least two magnetic field sensing elements, each configured to generate a respective magnetic field signal indicative of a detected magnetic field and a circuit responsive to the magnetic field signals from the at least two magnetic field sensing elements and configured to generate a current sensor output signal including a difference between the magnetic field signals from the at least two magnetic field sensing elements and indicative of the current carried by the respective conductor. Providing the plurality of conductors may include providing each conductor in the form of a bus bar. Providing the plurality of conductors may include providing the aperture at a position that is offset with respect to a center of a width of the first and second major surfaces. Providing the printed circuit board may include providing the printed circuit board with a T-shape, wherein a first portion of the T-shaped printed circuit board extends through the aperture of each of the plurality of conductors and a second portion of the T-shaped printed circuit board orthogonal with respect to the first portion abuts a major of surface of a conductor. The method may further include, for each current sensor, characterizing a magnetic coupling between the current sensor and each of the plurality of conductors and using the magnetic coupling characterization to determine the current in one or more of the plurality of conductors. Characterizing the magnetic coupling between the current sensor and each of the plurality of conductors may include determining a coupling factor indicative of a magnetic coupling between the current sensor and each of the plurality of conductors and generating a coupling matrix including one or more coupling factors for each current sensor.

Also described is a current sensor system including a plurality of current sensors, each including at least two field sensing elements, each configured to generate a respective magnetic field signal indicative of a detected magnetic field and a circuit responsive to the magnetic field signals from the at least two magnetic field sensing elements and configured to generate a current sensor output signal including a difference between the magnetic field signals from the at least two magnetic field sensing elements and indicative of the current carried by the respective conductor. The current sensor system further includes means for positioning each of the plurality of current sensors in an aperture of a respective conductor of a plurality of conductors, each conductor having a first major surface, a second major surface opposite the first major surface, and an aperture extending from the first major surface through a thickness of the conductor to the second major surface, wherein each of the plurality of conductors is configured to carry a current and wherein the apertures of each of the plurality of conductors are aligned with a common reference line. In embodiments, the current system positioning means includes a printed circuit board to which each of the plurality of current sensors is mounted, wherein the printed circuit board extends through the apertures of each of the plurality of conductors.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, fluxgate element, magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. For example, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
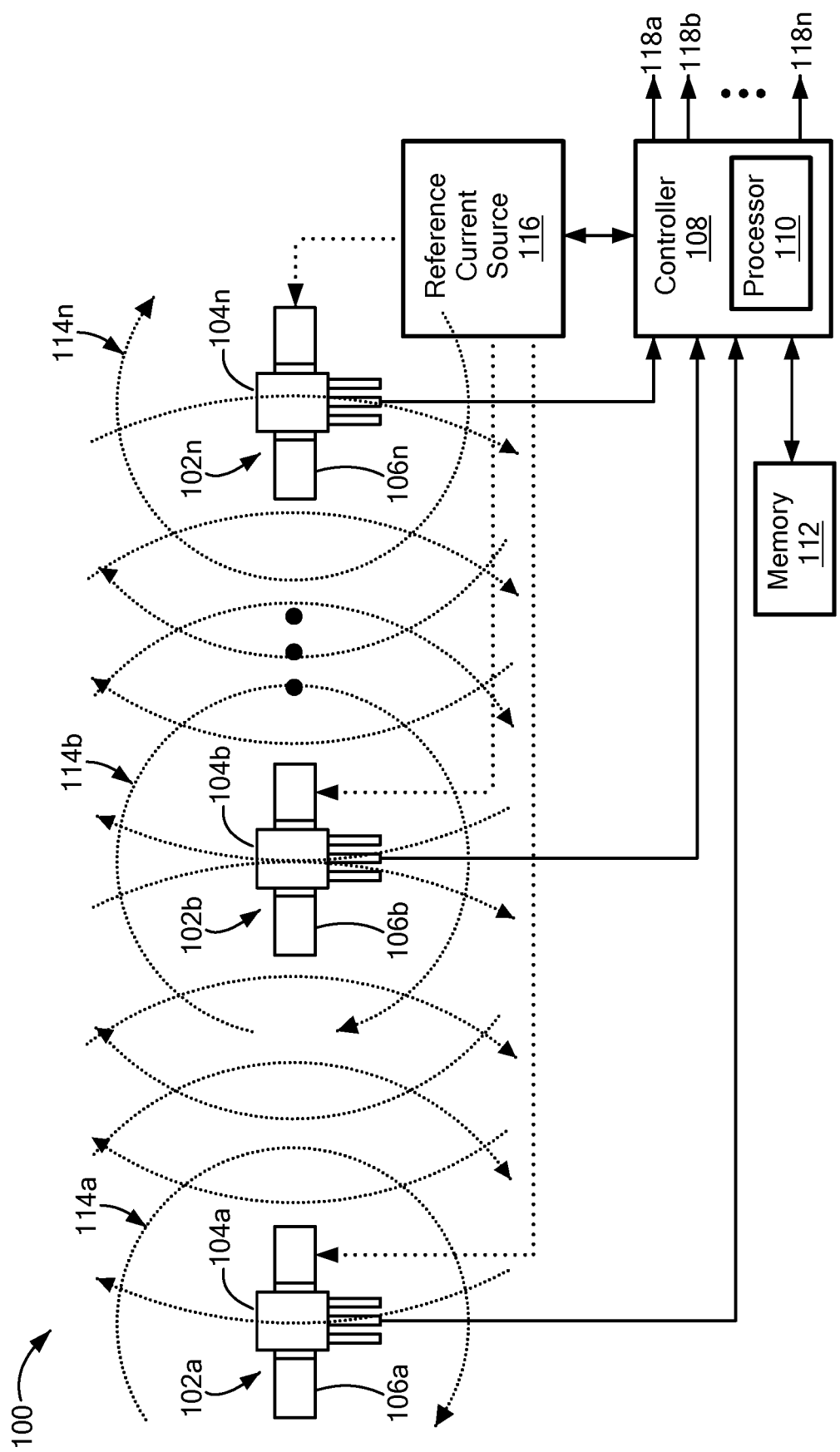
FIG. 1 shows a current sensor system having a plurality of current sensors, each positioned proximate to a current carrying conductor.

Now referring to FIG. 1, a current sensor system 100 is provided having a plurality of current sensors 104a-104n and a plurality of conductors 106a-106n, each conductor configured to carry a current to be measured. Each of the current sensors 104a-104n is positioned proximate to at least one of the conductors 106a-106n (e.g., and here proximate to a respective one of the conductors) such that the current sensor can measure the current through the respective conductor 106a-106n. The current sensors 104a-104n are spaced from the other, remaining ones of the plurality of conductors 106a-106n in the current sensor system 100. For example, current sensor 104a is positioned proximate to respective conductor 106a carrying a current intended to be measured by the current sensor 104a and is spaced a predetermined distance from the remaining ones of the plurality of conductors 106b-106n.

Each current sensor and its respective, proximate conductor can be considered to form a current sensor/conductor pairing 102a-102n within the current sensor system 100. Thus, current sensor system 100 may include a plurality a current sensor/conductor pairings.

A conductor (or multiple conductors) that a respective current sensor 104a-104n is paired with may be referred to as an intended conductor (or intended conductors). Although it is desirable for each current sensor to detect only the current through one or more intended current conductors (e.g., through the respective, most proximate current conductor), magnetic coupling can result in a current sensor sensing magnetic field generated not only by current through the intended conductor(s), but also magnetic field generated by current through the unintended, other ones of the plurality of conductors. For example, current sensor 104a is intended to sense the magnetic field 114a attributable only the current through conductor 106a. However, due to magnetic coupling, current sensor 104a may sense magnetic field 114a and 114b and, under such conditions, the output signal of current sensor 104a will not provide an accurate indication of the current through conductor 106a that is intended to be measured.

Each of the current sensors 104a-104n includes one or more magnetic field sensing elements configured to sense a magnetic field 114a-114n generated by a current through one or more of conductors 106a-106n and generate a magnetic field signal indicative of a detected magnetic field 114a-114n. Again, while it is desirable for each current sensor 104a-104n to sense only the magnetic field 114a-114n generated as a result of current flowing through the respective, proximate, intended conductor 106a-106n, magnetic coupling from one or more conductors adjacent to (rather than proximate to) the current sensor may occur. Such undesired magnetic coupling may be referred to as crosstalk.

Conductors 106a-106n can be coupled to a reference current source 116. Reference current source 116 can generate a reference current and provide the reference current to each of conductors 106a-106n. The reference current can be provided to conductors 106a-106n individually. For example, the reference current may be provided to conductors 106a-106n one at a time, such as in a predetermined order or randomly. In some embodiments, reference current source 116 can provide multiple reference currents to each of conductors 106a-106n. For example, in one embodiment, a sequence of reference currents may be provided to each of conductors 106a-106n.

Reference current source 116 may form part of the current sensor system 100. In other embodiments, reference current source 116 may be external to, and thus may be coupled to current sensor system 100 to provide one or more reference currents.

A controller 108 can be coupled to each of current sensors 104a-104n and to the reference current source 116. For example, an output of each of current sensors 104a-104n can be coupled to an input of controller 108. During operational times when the current sensor system 100 is characterizing magnetic coupling within the system, the controller 108 can receive an output signal (e.g., magnetic field signal) from each of current sensors 104a-104n that corresponds to a magnetic field attributable to the reference current provided to conductors 106a-106n. Controller 108 can also control the reference current source 116, such as to establish the reference current level and control the timing and ordering with which the reference current is provided to each of the conductors 106a-106n. During other operational times (e.g., when the conductors 106a-106n carry operational currents associated with normal system operation), the controller 108 can receive an output signal from each of the current sensors 104a-104n that corresponds to a magnetic field attributable to the operational current.

Controller 108 can use the output signals from the current sensors 104a-104n to characterize magnetic coupling between the current sensors 104a-104n and the plurality of conductors 106a-106n. In an embodiment, an intended coupling factor as used herein refers to the magnetic coupling between a current sensor and the one or more intended conductors 106a-106n carrying current intended to be measured by the current sensor. A parasitic coupling factor refers to undesired magnetic coupling, or crosstalk between a current sensor and conductors other than the intended conductor(s) (e.g., adjacent or neighboring ones of conductors 106a-106n not coupled to or paired with the current sensor).

Controller 108 may include a plurality of outputs 118a-118n. The number of controller outputs 118a-118n may correspond to the number of current sensors 104a-104n and/or the number of current sensor/conductor pairings 102a-102n. For example, in some embodiments, controller 108 may include an output 118a-118n for each current sensor 104a-104n or for each current sensor/conductor pairing 102a-102n.

In an embodiment, controller 108 may include a processor 110 and a memory 112. In some embodiments, memory 112 may be separate from controller 108 but communicatively coupled to controller 108. In an embodiment, controller 108 may be a computing device configured to receive current sensor output data and determine intended and parasitic magnetic coupling factors within current sensor system 100.

Memory 112 may include a volatile memory and/or a non-volatile memory. For example, the non-volatile memory can store computer instructions, an operating system and/or data for current sensor system 100. The data may include output signals and/or magnetic field signals received from each of current sensors 104a-104n. The data may further include one or more coupling matrices, one or more inverse coupling matrices, intended coupling factor information, parasitic coupling factor information, reference current information, and/or measured current information.

In some embodiments, each of current sensors 104a-104n may include integrated current sensors. For example, one or more magnetic field sensing elements may be provided in the form of an integrated circuit and/or include additional processing circuitry (e.g., circuitry shown in FIG. 4) and can be encapsulated with an electrically insulating material within current sensors 104a-104n. The magnetic field sensing elements and additional circuitry can be formed on a single semiconductor die, which is encapsulated and provided in the form of a single integrated circuit current sensor. In an alternate embodiment, the magnetic field sensing elements and additional circuitry can be formed on separate semiconductor die coupled with wire bonds or the like in a single or in multiple integrated circuit packages.

Figure 2:
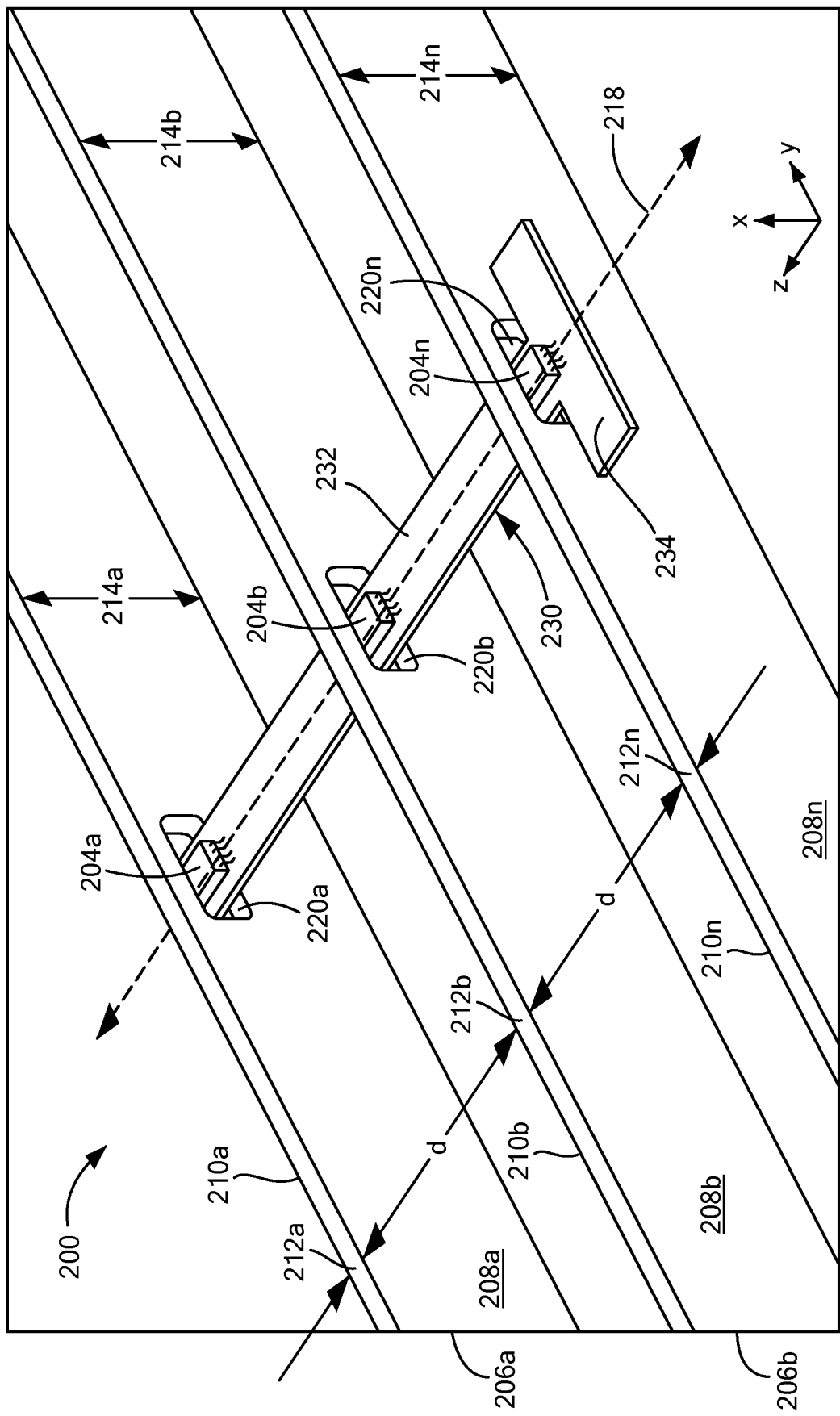
FIG. 2 is a perspective view of a current sensor system according to the disclosure.
Figure 2A:
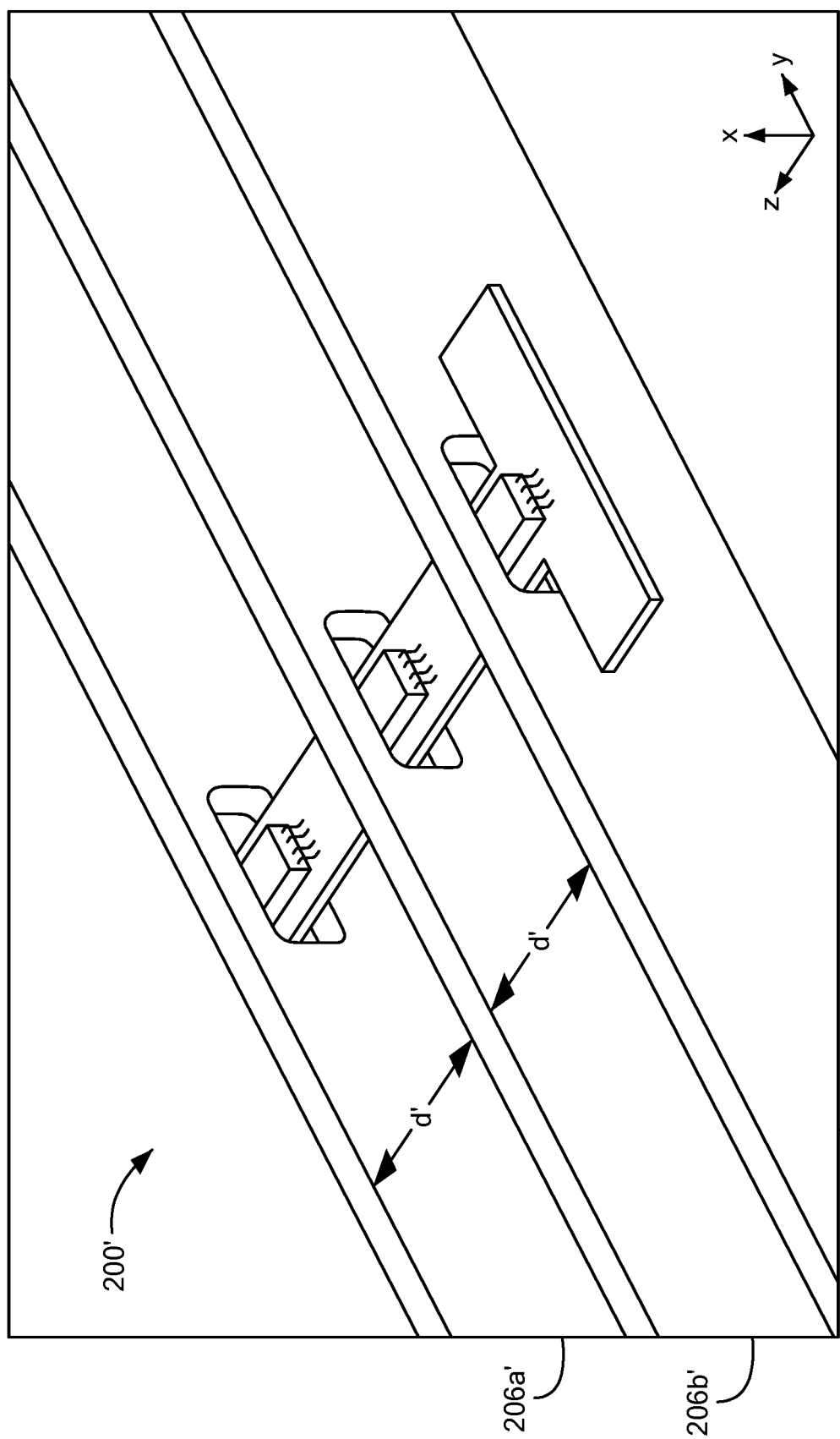
FIG. 2A is a perspective view of another current sensor system according to the disclosure.
Figure 3:
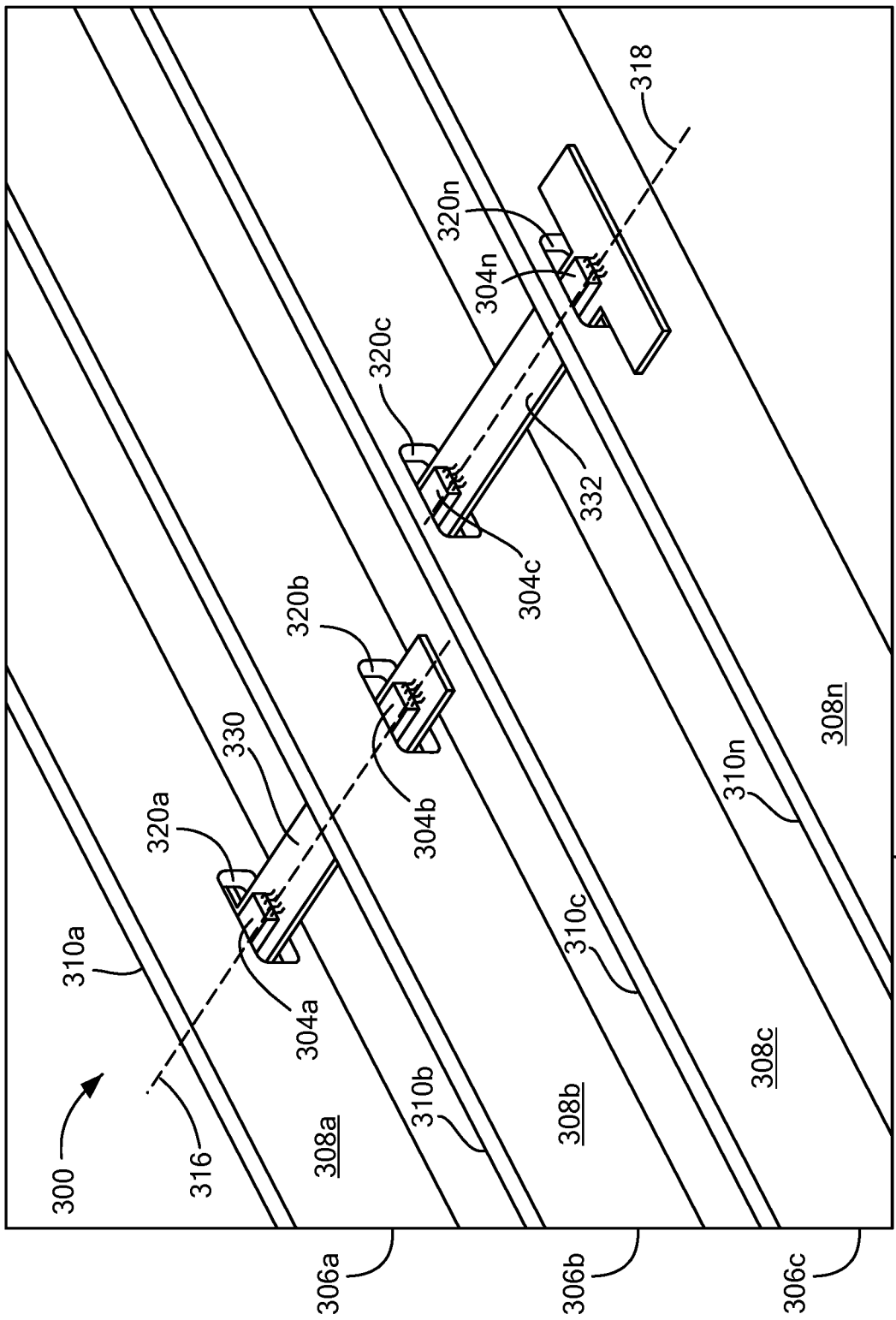
FIG. 3 is a perspective view of an alternative current sensor system according to the disclosure.

Current sensors 104a-104n may be coupled to and/or may be in contact with conductor a respective conductor 106a-106n so as to establish and maintain a fixed position relative to each other in order to achieve a highly repeatable and tightly controlled current sensor performance. FIG. 1 pictorially illustrates that conductors 106a-106n have notches or grooves configured to receive the respective current sensor 104a-104n. However, according to the disclosure, the conductors and sensors are configured as shown in FIG. 2, 2A or 3 such that each sensor is positioned in an aperture of the respective conductor. Further, the conductors are preferably arranged as shown in FIG. 2, 2A, or 3 rather than as shown pictorially in FIG. 1.

Referring now to FIG. 2, a current sensor system 200 includes a plurality of conductors 206a-206n, each having a first major surface 208a-208n, a second major surface 210a-210n opposite the first major surface, and an aperture 220a-220n extending from the first major surface through a thickness 212a-212n of the conductor to the second major surface. Each of the conductors 206a-206n is configured to carry a current to be measured. Although not shown in FIG. 2, current sensor system 200 can include elements that are the same as or similar to elements of FIG. 1. For example, system 200 can include a controller like controller 108, a processor like processor 110, a memory like memory 112, and a reference current source like reference current source 116.

Apertures 220a-220n of each of the plurality of conductors 206a-206n are aligned with a common reference line (labeled 218). A plurality of current sensors 204a-204n are provided, with each current sensor positioned at least partially in the aperture 220a-220n of a respective conductor 206a-206n. Each of the current sensors 204a-204n includes one or more magnetic field sensing elements. Example current sensors are shown and described in connection with FIGS. 4 and 5.

Conductors 206a-206n may be formed from conductive materials, such as copper. In some embodiments, conductors 206a-206n may be provided in the form of a bus bar or a flat conductor.

Apertures 220a-220n are formed in the conductors by any suitable process such as drilling and can have various shapes and sizes. For example, apertures 220a-220n can be in the form of slits or slots and can be substantially oval-shaped as shown. The size of the apertures 220a-220n is designed to be large enough so that a sensor and its supporting substrate (e.g., circuit board 230) can fit in the aperture, taking into account mechanical placement tolerances. Additionally, clearance/creepage distances must be maintained in order to meet application requirements for electrical isolation level.

In some embodiments, the apertures 220a-220n can be offset with respect to a center of a width 214a-214n of the conductors, as shown. Positioning the apertures 220a-220n so as to be offset in this way can reduce eddy currents in the conductors by reducing a size (e.g., diameter or path length) of closed loops in which eddy currents can flow in the vicinity of the sensing elements of the sensor. Since the presence of eddy currents can adversely influence the accuracy of sensing an intended current flow through a conductor, reducing eddy currents can improve overall accuracy of the current sensor system. It will be appreciated that the substrate and sensors can, in some embodiments, be flipped 180° so as to face downward with respect to the view of FIG. 2, in which case the location of the apertures may be varied.

In use, the conductors 206a-206n can be attached or secured or otherwise held together and/or to a suitable fixture or housing by various attachment mechanisms based on the application (not shown).

It will be appreciated that while the system 200 is shown to include three conductors 206a-206n, more or fewer conductors are possible. Hence "n" is an arbitrary number greater than one representing the number of conductors in the system 200. Further, while the conductors 206a-206n are shown to have the same dimensions to each other (e.g., thicknesses 212a-212n are the same and widths 214a-214n are the same), different conductors can have different thicknesses and/or widths. It will also be appreciated that while the views of FIGS. 2 and 2A show the conductors 206a-206n arranged substantially vertically (i.e., with their major surfaces aligned with the x-y plane, their thicknesses 212a-212n aligned with the z axis and their lengths aligned with the y axis), other arrangements are possible. For example, the conductors 206a-206n can alternatively be arranged substantially horizontally with respect to each other (i.e., the conductors can be rotated by 90 degrees so that their major surfaces are aligned with the y-z plane with the conductors "stacked" on top of each other with their apertures 220a-220n aligned with a common reference line 218, which line 218 would be along the x axis in this configuration).

Each of the current sensors 204a-204n can be mounted to or on a common substrate 230, such as the illustrated printed circuit board. It will be appreciated that other sub state types are possible. Printed circuit board 230 extends through the apertures 220a-220n such that each of the current sensors 204a-204n is aligned with a respective conductor 206a-206n. Alignment of the current sensors with the respective conductor will be explained further in connection with FIG. 5. Suffice it to say here that the one or more magnetic field sensing elements within each sensor is/are aligned with the respective conductor. Further, advantageously, by having all of the current sensors 204a-204n mounted to the same circuit board 230, the circuit board is inserted through all the busbars in a single operation.

The substrate 230 can have various shapes. For example, the illustrated substrate has a T-shape, with a first portion 232 extending through the apertures 220a-220n and a second portion 234 orthogonal to the first portion abutting a major surface 208n of conductor 206n, as shown. Use of a T-shaped substrate 230 can facilitate the mounting and improve the mechanical tolerances in order to achieve highly repeatable and tightly controlled current sensor performance.

The distance "d" between adjacent conductors 206a-206n can be varied to suit a particular application. Furthermore, while the distance between each two adjacent conductors is shown to be the same distance "d", in some embodiments, these distances can be different than each other.

Referring also to FIG. 2A, a current sensor system 200' includes conductors 206a'-206n' that are positioned closer together than conductors 206a-206n in FIG. 2; however, in all other respects conductors 206a'-206n' and system 200' may be the same as or substantially similar to conductors 206a-206n and system 200, respectively. In other words, the distance "d'" between adjacent conductors 206a'-206n' is smaller than the distance "d" between adjacent conductors 206ad-206n' in FIG. 2.

This closer arrangement of conductors 206a'-206n' can be advantageous in order to reduce the required area, or footprint of the current sensor system and thus, provide a more compact current sensor system 200' as compared to the system 200 of FIG. 2. It will be appreciated however, that the closer the conductors are to each other, the more undesired magnetic coupling, or crosstalk may occur between conductors and sensors. As will be described in connection with FIGS. 6 and 7, post-processing as may include matrix compensation can be used to reduce the effects of such crosstalk.

Referring to FIG. 3, an alternative current sensor system 300 includes conductors 306a-306n, each having a first major surface 308a-308n, a second major surface 310a-310n opposite the first major surface, and an aperture 320a-320n extending from the first major surface through a thickness of the conductor to the second major surface.

Each conductor 306a-306n has an aperture 320a-320n in which a current sensor 304a-304n is positioned, as shown. The current sensor system 300 differs from the system 200 in that the apertures 320a-320n of the conductors 306a-306n are not all aligned with the same common reference line. Rather, in the system 300, apertures 320a-320b of conductors 306a-306b are aligned with a first common reference line 316 and apertures 320c-320n of conductors 320c-320n are aligned with a second common reference line 318, as shown.

Current sensors 304a-304b can be mounted on a common substrate 330, such as the illustrated printed circuit board, that extends through the apertures 320a-320b along reference line 316 such that each of the current sensors 304a-304b is aligned with a respective conductor 306a-306b. Similarly, current sensors 304c-304n can be mounted on a common substrate 332 that extends through apertures 320c-320n along reference line 318 such that each of the sensors 304c-304n is aligned with a respective conductor 306c-306n, as shown.

Substrates 330, 332 can have various shapes including the illustrated T-shape, with a first portion on which the current sensors are mounted extending through the conductor apertures and a second portion orthogonal to the first portion abutting a major surface 308n of conductor, as shown for conductor 332.

Figure 4:
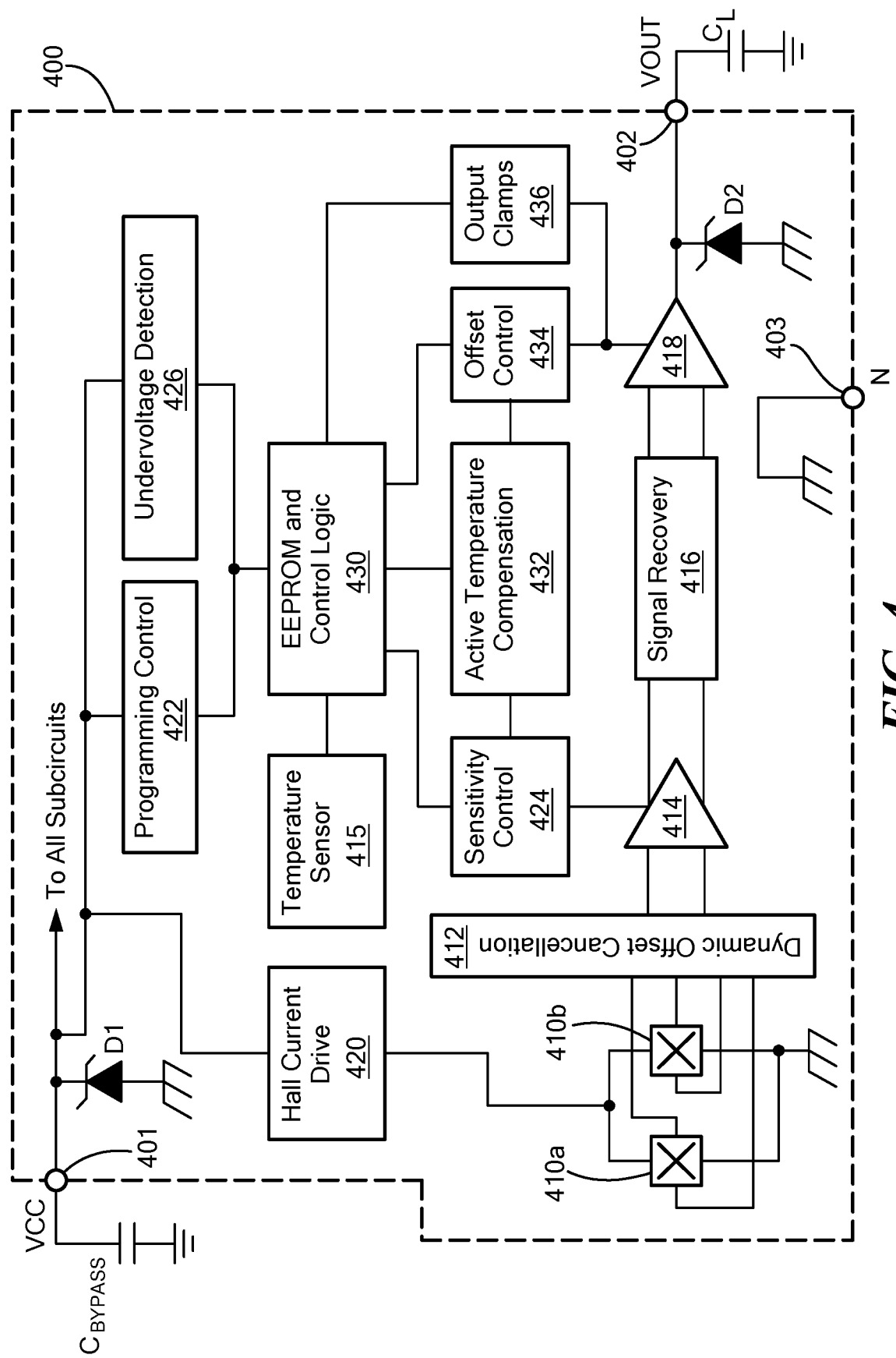
FIG. 4 is a circuit diagram of a current sensor for use in a current sensor system according to the disclosure.

Referring also to FIG. 4, an example current sensor 400 as may be the same as or similar to current sensors 104a-104n (FIG. 1), 204a-204n (FIGS. 2 and 2A), and/or 304a-304n (FIG. 3) is shown. Current sensor 400 includes one or more magnetic field sensing elements, and here two sensing elements 410a, 410b. Sensing elements 410a, 410b can be Hall effect elements or other magnetic field transducer element types.

Use of two or more sensing elements 410a, 410b permits differential magnetic field sensing, as may be advantageous to improve immunity (i.e., insensitivity) to common-mode stray magnetic fields as may occur due to crosstalk between conductors. The output of the sensor VOUT is proportional to $\Delta B = B_R - B_L$ where $B_R$ represents magnetic field incident on one of the sensing elements (e.g., so-called "right" sensing element 410b) and & represents magnetic field incident on the other one of the sensing elements (e.g., so-called "left" sensing element 410a). The sensor output VOUT is also affected by the sensitivity, $\alpha$, of the signal path and can be represented as follows:

$$VOUT = \alpha \times \Delta B \quad (1)$$

The relationship between the conductor current to be measured and the differential field $\Delta B$ can be represented by a coupling factor, CF as follows:

$$\Delta B = CF \times I \quad (2)$$

It will be appreciated that coupling factor CF corresponds to coupling between a given current sensor and its proximate conductor and thus, corresponds to what is referred to herein as the intended coupling factor. With such differential sensing architecture, common mode stray fields are rejected.

Current sensing accuracy is affected by mechanical mounting tolerances of the sensors (e.g., especially along the x and z axis of FIGS. 2, 2A, and 3). By tightly controlling the position of sensors 204a-204n in respective conductor apertures 220a-220n, sensitivity to mechanical mounting tolerances can be lower than otherwise possible.

Sensing accuracy is further affected by eddy currents in the conductors. The term "bandwidth" is used herein to refer to the range of conductor current frequency for which the output of the sensor is not significantly affected by the frequency. Advantageously, the bandwidth of a sensor system can be tuned by adjusting the position of the respective conductor aperture along the x axis in FIGS. 2, 2A, and 3.

It will be appreciated that while differential sensing may be preferred in embodiments for reasons discussed above, advantages of the configuration of FIGS. 2, 2A, and 3 (e.g., ease of sensor mounting, reduced sensitivity to mounting tolerances, improved bandwidth, and compactness) can be achieved even using sensors having only a single element. Furthermore, it will also be appreciated that differential sensing can be implemented with more than two sensing elements and can include the use of sensing elements arranged in a bridge configuration.

Example current sensor 400 has three pins in this embodiment, including a VCC (supply voltage) pin 401, a VOUT (output signal) pin 402, and a GND (ground) pin 403. The VCC pin 401 is used for the input power supply or supply voltage for the current sensor 400. A bypass capacitor, CBYPASS, can be coupled between the VCC pin 401 and ground. The VCC pin 401 can also be used for programming the current sensor 400. The VOUT pin 402 is used for providing the output signal for the current sensor 400 to circuits and systems (not shown) such as controller 108 (FIG. 1) and can also be used for programming. An output load capacitance $C_L$ is coupled between the VOUT pin 402 and ground. The example current sensor 400 can include a first diode D1 coupled between the VCC pin 401 and chassis ground and a second diode D2 coupled between the VOUT pin 402 and chassis ground.

Magnetic field signals generated by the magnetic field sensing elements 410a, 410b are coupled to a dynamic offset cancellation circuit 412, which is further coupled to an amplifier 414. The amplifier 414 is configured to generate an amplified signal for coupling to the signal recovery circuit 416. Dynamic offset cancellation circuit 412 may take various forms including chopping circuitry and may function in conjunction with offset control 434 to remove offset that can be associated with the magnetic field sensing elements 410a, 410b and/or the amplifier 414. For example, offset cancellation circuit 412 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 400 to regulate the supply voltage.

A programming control circuit 422 is coupled between the VCC pin 401 and EEPROM and control logic 430 to provide appropriate control to the EEPROM and control logic circuit. EEPROM and control logic circuit 430 determines any application-specific coding and can be erased and reprogrammed using a pulsed voltage. A sensitivity control circuit 424 can be coupled to the amplifier 414 to generate and provide a sensitivity control signal to the amplifier 414 to adjust a sensitivity and/or operating voltage of the amplifier 414. An active temperature compensation circuit 432 can be coupled to sensitivity control circuit 424, EEPROM and control logic circuit 430, and offset control circuit 434. The offset control circuit 434 can generate and provide an offset signal to a push/pull driver circuit 418 (which may be an amplifier) to adjust the sensitivity and/or operating voltage of the driver circuit 418. The active temperature compensation circuit 432 can acquire temperature data from EEPROM and control logic circuit 430 via a temperature sensor 415 and perform necessary calculations to compensate for changes in temperature, if needed. Output clamps circuit 436 can be coupled between the EEPROM and control logic 430 and the driver 418 to limit the output voltage and for diagnostic purposes. For example, if the total output range can be from 0V to 5V, for magnetic fields from 0 G to 1000 G, it may be desired to use a clamp at 0.5V for any field below 100 G. For example, it may be known that below 100 G, the sensor 400 does not return a trustable signal. Hence, if the IC output is 0.5V, it is evident that the measurement is not valid and cannot be trusted. Or clamps at 1V and 4V could be used and the 0-1V and 4-5V ranges is used for communicating diagnostic information (e.g., 4.5V on the output could indicate "Hall plate is dead" and 0.5V could indicate "Undervoltage VCC detected", etc.). An undervoltage detection circuit 416 can operate to an undervoltage condition of the supply voltage level VCC. It will be appreciated that FIG. 4 shows an example current sensor 400 primarily as a digital implementation, any appropriate current sensor can be used in accordance with the present disclosure, including both digital, analog, and combined digital and analog implementations.

Figure 5:
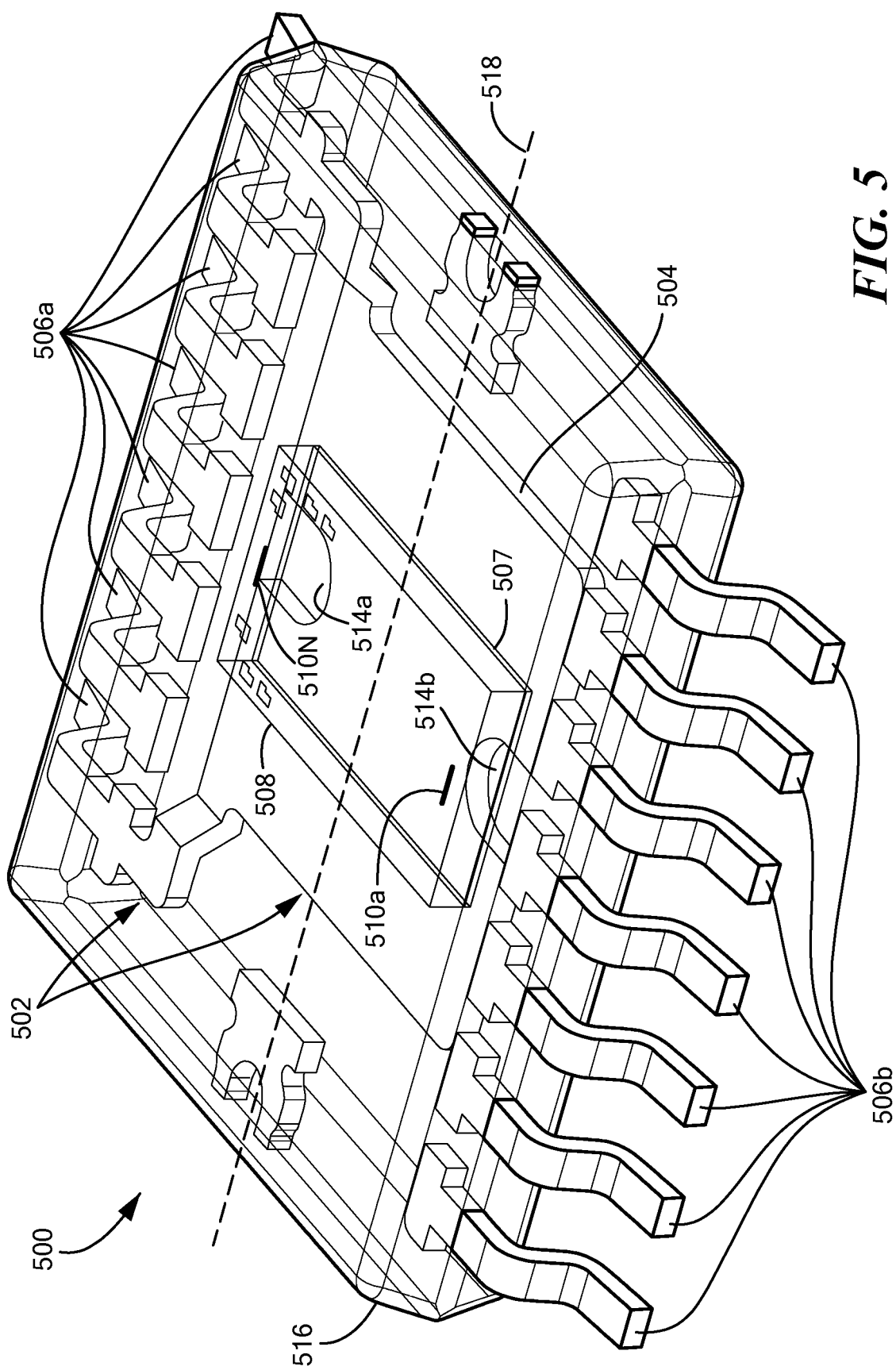
FIG. 5 is a view perspective view of a current sensor for use in a current sensor system according to the disclosure.

Referring also to FIG. 5, an example current sensor 500 as may be the same as or similar to current sensors 104a-104n (FIG. 1), 204a-204n (FIGS. 2 and 2A), 304a-304n (FIG. 3), and/or 400 (FIG. 4) is shown. Current sensor 500 includes one or more magnetic field sensing elements, and here two sensing elements 510a, 510N. Sensing elements 510a, 510N can be Hall effect elements or other magnetic field transducer element types configured to permit differential magnetic field sensing as discussed above in connection with FIG. 4. It will be appreciated that sensing elements 510a, 510N can represent individual sensing elements or groups of sensing elements as may be provided in a bridge configuration.

Features of current sensor 500 include a lead frame 502 and a substrate 508 supporting magnetic field sensing elements 510a, 510N. Current sensor 500 can be mounted on a circuit board (e.g., circuit board 230 of FIG. 2) and positioned in an aperture of a respective conductor. Lead frame 502 includes a die attach paddle 504 and a plurality of leads 506a, 506b. Die 508 is attached to die attach paddle 504, as may be achieved with an adhesive layer 507. While a single semiconductor die 508 is shown, the current sensor 500 can include more than one die, with each such die supporting magnetic field sensing element(s) and/or supporting circuitry. Additional features of the example current sensor 500 can include one or more cutouts, slits, slots or apertures 514a, 514b in the paddle 504 to reduce eddy currents and mold material 516 to enclose die attach paddle 504, substrate 508, magnetic field sensing elements 510a-510N and portions of leads 506a, 506n, as shown. Aspects of current sensor 500 are shown and described in U.S. Pat. No. 10,481,181, entitled "Systems and Methods For Current Sensing" and issued on Nov. 19, 2019, which patent is hereby incorporated herein by reference in its entirety.

In use, current sensor 500 is configured to be positioned proximate to a conductor, such as shown in the configurations of FIGS. 2, 2A, and 3 in order to sense a current through the conductor. With this arrangement, sensing element 510a would experience magnetic field in a first direction (e.g., upward along the x axis in the view of FIG. 2) and sensing element 510N would experience field in a second, opposite direction (e.g., downward along the x axis in the view of FIG. 2).

As noted above, each current sensor is positioned at least partially in the aperture of a respective conductor. More particularly, the current sensors are positioned so that their magnetic field sensing element(s) are centered with respect to the conductor width 212a-212n (FIG. 2). Thus, in the example current sensor 500 of FIG. 5 in which differential sensing performed by sensing elements 510a, 510N that are spaced from each other and are substantially equidistant from a centerline 518, in use, sensor 500 is positioned in a respective conductor aperture so that the centerline 518 is substantially coincident with a center of the conductor width 212a-212n (FIG. 2).

The closer the sensing elements 510a, 510N are to each other, the better the rejection to stray fields; however, the further apart the sensing elements 510a, 510N are with respect to each other, the larger the resulting differential signal and the better the signal to noise ratio. Furthermore, the further the sensing elements 510a, 510N are from the conductor, the smaller the resulting signal strength. Thus, the spacing between sensing elements 510a, 510N can be optimized account for these competing requirements accordingly. Furthermore, generally, the element spacing is dictated by the dimensions of the sensor IC package.

It will be appreciated that in embodiments in which a current sensor has only a single sensing element, the current sensor is positioned in the respective conductor aperture so that the single sensing element is offset from the center of the conductor width along the z axis. The specific spacing between current sensor 500 and its sensing elements 510a, 510N with respect to a conductor may be designed based at least in part on the dimensions of the current sensor (and its magnetic field sensing elements(s)) and the conductor, the sensitivity of the magnetic field sensing element(s) within the current sensor, and/or the level of current intended to be measured.

Figure 6:
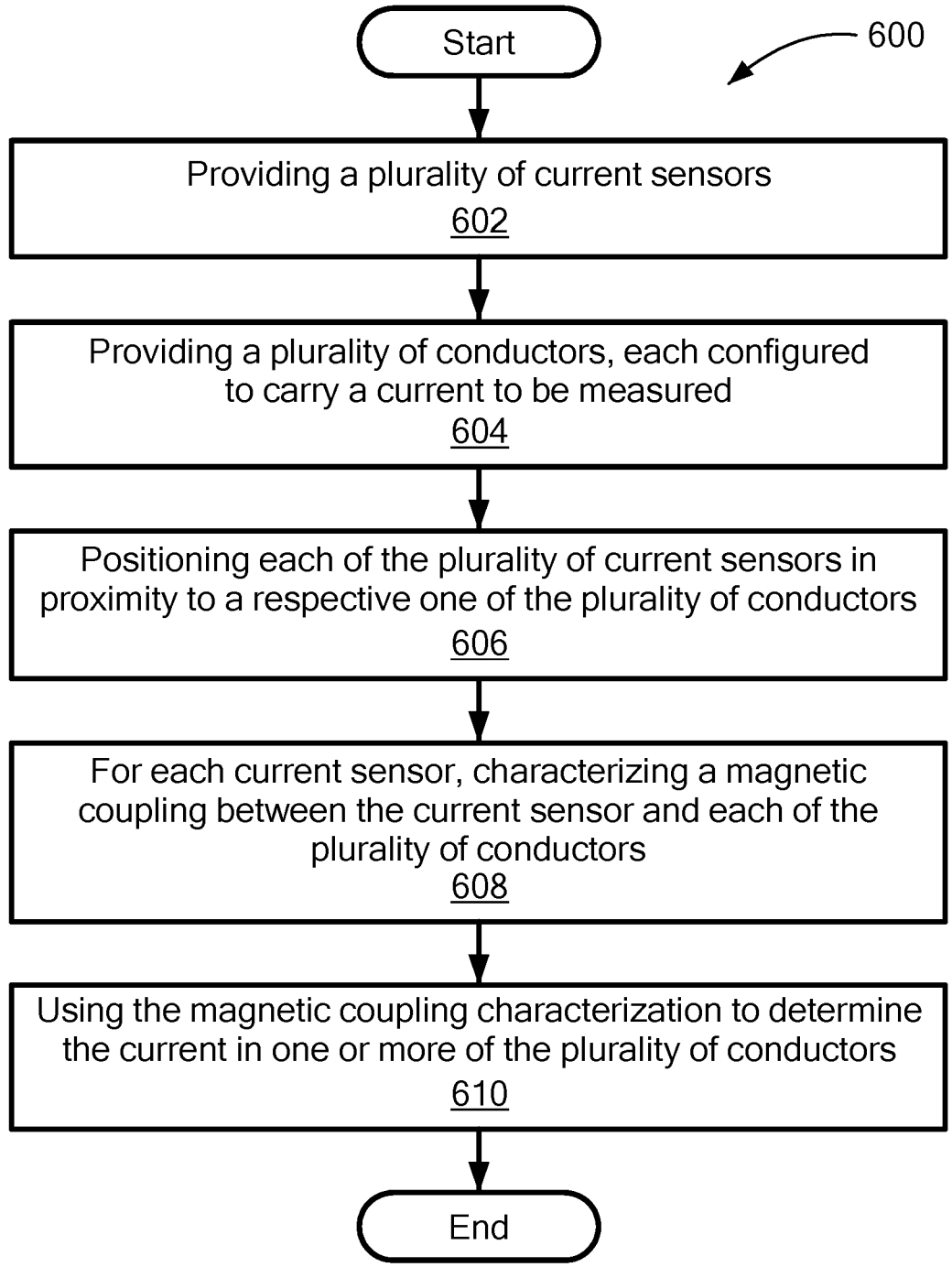
FIG. 6 is a flow diagram of a method for determining a current in a plurality of conductors of the current sensor system of FIG. 1.

Referring to FIG. 6, a method for determining a current in one or more of a plurality of conductors in a multi-conductor current sensor system (e.g., system 100, 200) begins at block 602, by providing a plurality of current sensors (e.g., sensors 204a-204n). At block 604, a plurality of conductors (e.g., conductors 206a-206n) are provided, each of the conductors configured to carry a current to be measured.

At block 606, each of the plurality of current sensors is positioned in proximity to a respective conductor carrying a current intended to be measured by the current sensor and is spaced from the other ones of the plurality of conductors. For example, sensor 204a is positioned in proximity to conductor 206a and spaced from conductors 206b-206n, as shown in FIG. 2.

In some applications, the plurality of conductors are positioned close enough such that magnetic coupling from adjacent conductors (i.e., crosstalk) can impact the ability of a current sensor, and thus the magnetic field sensing element, to accurately sense and measure the current through the respective, intended conductor. At block 608, the magnetic coupling from adjacent conductors can be determined for use to compensate for the unwanted coupling. At block 608, for each current sensor, a magnetic coupling between the current sensor and each of the plurality of conductors is characterized. To determine the magnetic coupling between a current sensor and each of the conductors, a reference current can be provided to each of the conductors in the current sensor system. This may be referred to as a characterization measurement. The reference current can be provided to each of the conductors individually or to a group of conductors simultaneously and the outputs from each of the current sensors in the current sensor system can be measured simultaneously or sequentially or the outputs from a subset of current sensors in the current sensor system can be measured.

For example, the reference current can be provided to a first conductor at a first time period, to a second conductor at a second time period and to a third conductor at a third time period. At each time period, the output at each of the current sensors can be measured. For example, at the first time period, the output at each of the current sensors is responsive to the reference current provided to the first conductor, at the second time period, the output at each of the current sensors is responsive to the reference current provided to the second conductor, and at the third time period, the output at each of the current sensors is responsive to the reference current provided to the third conductor.

As the reference current is provided to each of the conductors, the conductors can generate a magnetic field that is sensed by magnetic field sensing elements of each of the current sensors. The magnetic field sensing elements can generate a magnetic field signal corresponding to the sensed field.

The reference current may be provided at a predetermined level that is sufficiently high current to allow a resulting magnetic field to be detected by each of the current sensors in the system. Thus, the level of the reference current may be based at least in part on the types, dimensions, and properties of the conductors and/or the current sensors.

An intended coupling factor as used herein refers to the magnetic coupling between a current sensor and the conductor which it is paired with in a current sensor system (i.e., the conductor(s) carrying the current that the respective current sensor is intended to measure). A parasitic coupling factor refers to the magnetic coupling between the current sensor and or neighboring conductor that is not paired with the current sensor (i.e., not the conductor carrying the current that the current sensor is intended to measure).

In some embodiments, the coupling factors can be determined by dividing the current sensor output signal by the reference current. For example, the characterization measurement yields an intended coupling factor $$\left(e.g., k_n = \frac{U_n}{I_n}\right)$$

and one or more parasitic coupling factors $$\left(e.g., k_{pnm} = \frac{U_{npnm}}{I_{pnm}}\right),$$

where I represents the current provided to the respective conductor, $k_n$ represents the coupling factor for an intended conductor, $k_{pn}$ represents the coupling factor for a parasitic conductor, and U represents the measured output of the current sensor. The intended coupling and parasitic coupling factors can be provided in units of sensor output voltage per conductor current (e.g., mV/A).

The characterization measurement can be repeated for each of the conductors in the current sensor system. The characterization measurement can be performed by a controller (e.g., controller 108 of FIG. 1) coupled to each of the current sensors. The controller can receive an output signal, responsive to the reference current provided to each of the conductors, from each of the current sensors.

The controller can generate a coupling matrix comprising the intended coupling factor and one or more parasitic coupling factors for each of the current sensors. For example, in an embodiment having n conductors, the relation between conductor currents and current sensor outputs can be provided by the following matrix equation:

$$\begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix} \begin{pmatrix} I_1 \\ I_2 \\ \vdots \\ I_n \end{pmatrix} = \begin{pmatrix} U_1 \\ U_2 \\ \vdots \\ U_n \end{pmatrix}$$

where I represents the current through a respective conductor, $k_n$ represents the coupling factor for an intended conductor, $k_{pn}$ represents the coupling factor for a parasitic conductor, and U represents the measured output of a current sensor. In the above matrix equation, a matrix containing the currents provided to each of the n conductors can be multiplied by the coupling matrix containing the intended coupling factors and parasitic coupling factors to provide a matrix containing the measured outputs of each of the current sensors.

As provided in the above matrix equation, the intended coupling factors and parasitic coupling factors form a coupling matrix, K, represented as follows:

$$K = \begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix}$$

The coupling matrix includes a plurality of columns and rows, for example with the number of columns corresponding to the number of conductors in the current sensor system and the number of rows corresponding to the number of current sensors a in the current sensor system. For example, each row and column of the coupling matrix may include at least one entry for an intended coupling factor for an intended conductor and one or more entries for parasitic coupling factors for the remaining conductors in the current sensor system. Thus, the size of the coupling matrix may vary based at least on the number of current sensors and/or the number of conductors in a particular current sensor system.

In an embodiment, if only one conductor current is non-zero, the respective intended coupling factor $k_n$ and the one or more parasitic coupling factors $k_{pnm}$ for the adjacent conductors can be determined. Thus, to calibrate a current sensor system, one conductor current can be set to a non-zero reference current and the remaining conductor currents can be forced to zero to determine the coupling factors. For example, for $I_1 \neq 0$ and $I_2$ through $I_n = 0$, the resulting relation between conductor currents and current sensor outputs can be provided by the following matrix:

$$\begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix} \begin{pmatrix} I_1 \\ 0 \\ \vdots \\ 0 \end{pmatrix} = \begin{pmatrix} U_1 \\ U_2 \\ \vdots \\ U_n \end{pmatrix}$$

with $k_1 = \frac{U_1}{I_1}$, $k_{p21} = \frac{U_2}{I_1}$ and $k_{pn1} = \frac{U_n}{I_1}$.

The coupling matrix K can be inverted to generate an inverse coupling matrix, $K^{-1}$. The inverse coupling matrix $K^{-1}$ can be generated by the same controller that generates the coupling matrix K (e.g., controller 108 of FIG. 1). Alternatively, the inverse coupling matrix $K^{-1}$ can be generated by a separate controller that is part of or external to the current sensor system.

To invert the coupling matrix, various techniques can be used as is known, including but not limited to: Gaussian elimination, Cayley-Hamilton method, Eigen decomposition, Cholesky decomposition, etc. In some embodiments, the coupling matrix can be inverted using an identity matrix.

The identity matrix can be represented as follows:

$$\text{Identity} = \begin{pmatrix} 1 & 0 & \cdots & 0 \\ 0 & 1 & \cdots & 0 \\ \vdots & \vdots & \ddots & \vdots \\ 0 & 0 & \cdots & 1 \end{pmatrix}$$

Using the identity matrix, the coupling matrix can be converted into a double-wide matrix having the coupling matrix on one side (here left) and the identity matrix on the other side (here right):

$$\text{Double-Wide} = \begin{bmatrix} \begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix} \begin{pmatrix} 1 & 0 & \cdots & 0 \\ 0 & 1 & \cdots & 0 \\ \vdots & \vdots & \ddots & \vdots \\ 0 & 0 & \cdots & 1 \end{pmatrix} \end{bmatrix}$$

Matrix row operations can be performed to convert the left side of the double-wide matrix into the identity. For example, the controller may include a processor having a multiplier to perform the matrix row operations.

Now that the left-hand side of the double-wide matrix contains the identity, the right-hand side contains the inverse coupling matrix, $K^{-1}$. In some embodiments, the inverse coupling matrix can be confirmed by multiplying the coupling matrix by the inverse coupling matrix which should provide the identity matrix.

The magnetic coupling characterization can be performed once for a given multi-conductor system design, particularly in applications with relatively large distances between conductors and respective sensors since sensitivity to misplacement is relatively low in such applications. Alternatively however, it will be appreciated that the magnetic coupling characterization can be performed more than once.

At block 610, the magnetic coupling characterization can be used to determine the current in one or more of the plurality of conductors. In an embodiment, a matrix equation can be generated (e.g., by the controller 108), using the inverse coupling matrix, to determine the currents in each of the conductors. For example, the following matrix equation can be generated to represent the relationship between measured currents I and measured current sensor outputs U using the inverse coupling matrix, $K^{-1}$:

$$\begin{pmatrix} I_1 \\ I_2 \\ \vdots \\ I_n \end{pmatrix} = K^{-1} \begin{pmatrix} U_1 \\ U_2 \\ \vdots \\ U_n \end{pmatrix}$$

The above matrix equation can be used (e.g., by controller processor 110) to determine the current in one or more of the conductors using the inverse coupling matrix $K^{-1}$ and the outputs $U_1$-$U_n$ of the current sensors.

In some embodiments, the current through one or more of conductors can be determined based on the currents through each of the other conductors. In this case, during the magnetic coupling characterization, the output of one of the current sensors in the system need not be measured. For example in certain current sensor system applications, the sum of all the currents provided to a load can be zero. In such an embodiment, the coupling matrix and corresponding inverse coupling matrix can be determined using the known relationship between the currents through all of the conductors.

For example, in an application having three conductors (in which the sum of the conductor currents during system operation is zero) with the output of the middle current sensor missing, the relationship between the currents can be represented by the following equations:

$I_1 + I_2 + I_3 = 0$, where $I_2 = -I_1 - I_3$

The missing current, $I_2$, can be substituted with $-I_1 - I_3$ in the matrix equation. Thus, the matrix equation reduces to:

$$\begin{pmatrix} k_1 - k_{p12} & k_{p13} - k_{p12} \\ k_{p31} - k_{p32} & k_3 - k_{p32} \end{pmatrix} \begin{pmatrix} I_1 \\ I_3 \end{pmatrix} = \begin{pmatrix} U_1 \\ U_3 \end{pmatrix}$$

Thus, a coupling matrix, K, can be represented as follows:

$$K = \begin{pmatrix} k_1 - k_{p12} & k_{p13} - k_{p12} \\ k_{p31} - k_{p32} & k_3 - k_{p32} \end{pmatrix}$$

The above coupling matrix can be inverted using the same techniques described above to provide an inverse coupling matrix. The inverse coupling matrix can provide equations for $I_1$ and $I_3$. Thus, $I_2$ can be determined using the equation $I_2 = -I_1 - I_3$.

Figure 7:
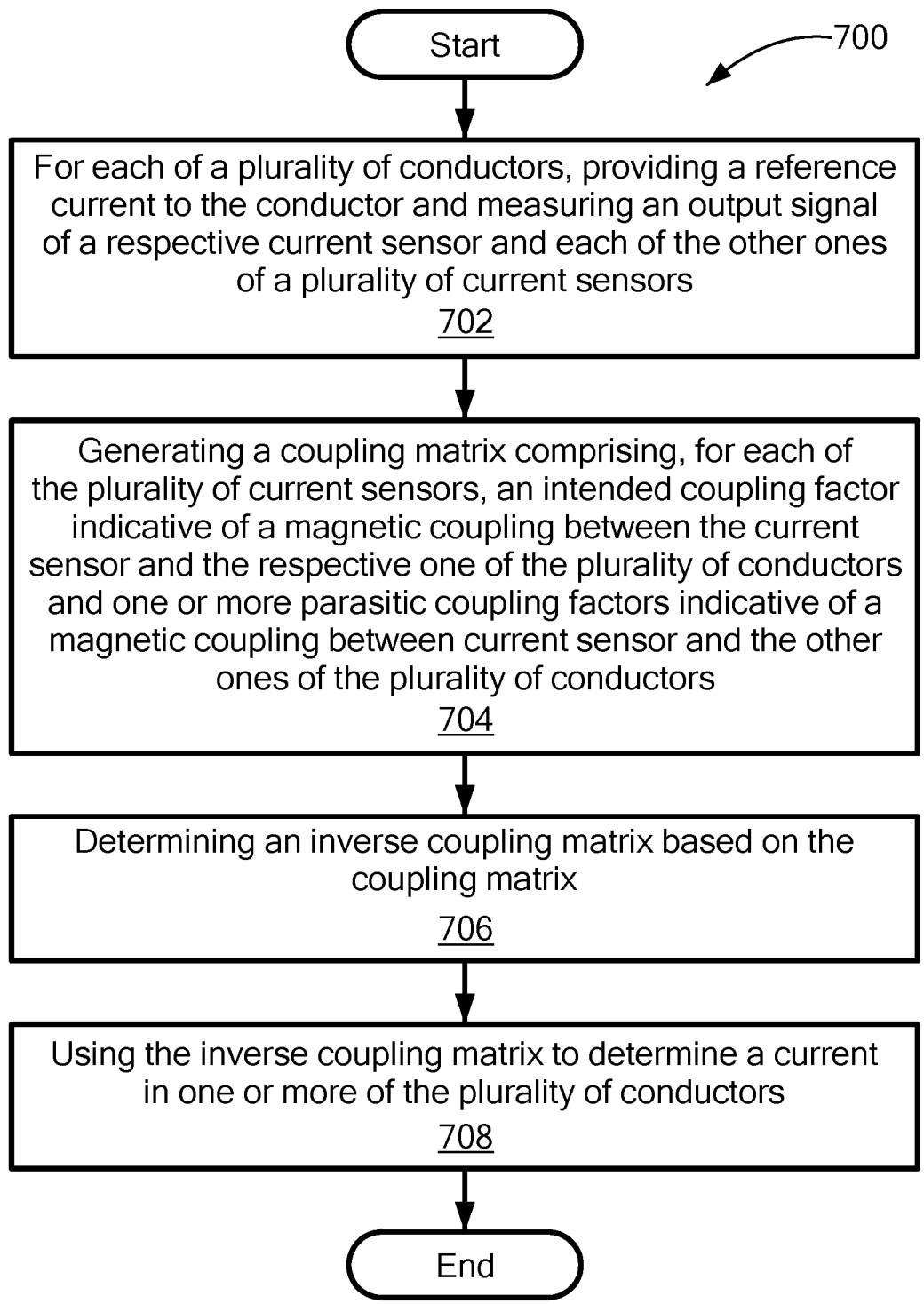
FIG. 7 is a flow diagram of a method for determining a current in a plurality of conductors of the current sensor system of FIG. 1.

Referring to FIG. 7, a method 700 for determining a current in a plurality of conductors of a multi-conductor current sensor system is illustrated. The method 700 corresponds generally to blocks 608 and 610 of FIG. 6 and aspects are described in U.S. patent application Ser. No. 15/435,725, entitled "Current Sensor System" and filed on Feb. 17, 2017, which application is hereby incorporated herein by reference in its entirety. The magnetic coupling characterization begins at block 702 by providing a reference current to a conductor and measuring an output signal of a respective current sensor and each of the other ones of a plurality of current sensors. Block 702 is repeated for each of the plurality of conductors.

To determine a coupling factor for each of the conductors, a reference current can be provided to each of the conductors individually and then an output, responsive to the reference current being provided to a respective conductor, can be measured individually at each of the current sensors. This measurement may be referred to as a characterization measurement as it provides a characterization of the magnetic coupling effect of a respective conductor with respect to each of the plurality of current sensors.

In some embodiments, multiple reference currents (e.g., a sequence of currents) may be provided to each of the conductors individually and then an output, responsive to the multiple reference currents being provided to a respective conductor, can be measured individually at each of the current sensors. In such an embodiment, a total or average coupling factor can be determined. For example, in one embodiment, a first current having a positive value and a second current having a negative value may be provided to each of the conductors to determine an average coupling factor.

The reference current can be provided to each of the conductors sequentially, in a predetermined order. In other embodiments, the reference current can be provided to each of the conductors randomly.

For each conductor, a measurement is taken at the output for each of the current sensors, responsive to the current being provided to the respective conductor. Thus, for each conductor, the number of measurements taken can correspond to the number of current sensors in the current sensor system.

The reference current can be generated and provided by a reference current source coupled to each of the conductors. The reference current source may include various circuitry disposed within the current sensor system and configured to generate a current.

The level (e.g., strength) of the reference current can be sufficiently high that when the reference current is provided to a conductor, the conductor generates a magnetic field strong enough that each of the current sensors in the current sensor system can sense the magnetic field generated by the respective conductor.

In some embodiments, each of the current sensors can generate an output signal corresponding to a sensed magnetic field. For example, each current sensor includes a magnetic field sensing element that can sense the magnetic field generated by the respective conductor and generate a magnetic field signal corresponding to the sensed or detected magnetic field.

The output of each of the current sensors can be coupled to a controller. The controller can receive an output signal from each of the current sensors corresponding to the sensed magnetic field. The controller can store each of the received output signals from each of the current sensors. For example, the controller may include a memory device. The memory may include, but not be limited to, a database, one or more look-up tables for storing and organizing captured data from one or more current sensors, collected by a controller of a respective current sensor, as well as any tables or matrices (e.g., coupling matrix, inverse coupling matrix) generated using the captured data. In some embodiments, the controller can be coupled to the memory device.

At block 704, a coupling matrix can be generated comprising, for each of the plurality of current sensors, an intended coupling factor indicative of a magnetic coupling between the current sensor and the respective one of the plurality of conductors and one or more parasitic coupling factors indicative of a magnetic coupling between the current sensor and other ones of the plurality of conductors.

In an embodiment, the controller can generate a coupling matrix as described above. In some embodiments, the coupling matrix can be generated having one or more average intended coupling factors and one or more average parasitic coupling factors. For example, if multiple reference currents are provided to each of the conductors, an average coupling matrix can be generated having average intended coupling factors and average parasitic coupling factors.

In an embodiment, the coupling matrix may be generated by a remote or external computing device that is remote and/or external to the controller and/or the current sensor system. For example, the controller may be communicatively coupled to the remote computing device and can transmit the output signals received from each of the current sensors to the remote computing device.

At block 706, an inverse coupling matrix can be determined based on the coupling matrix as described above and at block 708, the inverse coupling matrix can be used to determine a current in one or more of the plurality of conductors as described above.

Having described preferred embodiments, which serve to illustrate various concepts, structures and techniques, which are the subject of this patent, it will now become apparent that other embodiments incorporating these concepts, structures and techniques may be used.

By way of a non-limiting example, current sensor systems described herein can have one current sensor paired with one conductor both mechanically and for current sensing purposes, it is possible for a current sensor to be paired with multiple intended conductors or for one conductor to be paired with multiple current sensors (e.g., such sensors have different sensing ranges or characteristics). Thus in some embodiments, the number of current sensors and conductors in a current sensor system may not be equal. In embodiments having one or more current sensors than conductors, crosstalk compensation can be as described in a co-pending U.S. patent application Ser. No. 15/999,122, entitled "Current Sensor System" and filed on Aug. 17, 2018, which application is hereby incorporated herein by reference in its entirety.

Accordingly, it is submitted that the scope of the patent should not be limited to the described embodiments but rather should be limited only by the spirit and scope of the following claims.

What is claimed is:

1. A current sensor system comprising:
    a plurality of conductors, each having a first major surface, a second major surface opposite the first major surface, and a through hole extending from the first major surface through a thickness of the conductor to the second major surface, wherein each of the plurality of conductors is configured to carry a current and wherein the through holes of each of the plurality of conductors are aligned with a common reference line; and
    a plurality of current sensors, each positioned at least partially in the through hole of a different respective conductor and comprising one or more magnetic field sensing elements.

2. The current sensor system of claim 1, wherein each of the plurality of current sensors comprises:
    at least two magnetic field sensing elements, each configured to generate a respective magnetic field signal indicative of a detected magnetic field; and a circuit responsive to the magnetic field signals from the at least two magnetic field sensing elements and configured to generate a current sensor output signal comprising a difference between the magnetic field signals from the at least two magnetic field sensing elements and indicative of the current carried by the respective conductor.

3. The current sensor system of claim 1, wherein each of the plurality of conductors comprises a bus bar.

4. The current sensor system of claim 1, wherein each of the plurality of current sensors is mounted on a substrate.

5. The current sensor system of claim 4, wherein the substrate comprises a printed circuit board.

6. The current sensor system of claim 5, wherein each of the plurality of current sensors is mounted on the same printed circuit board.

7. The current sensor system of claim 6, wherein the printed circuit board extends through the through hole of each of the plurality of conductors.

8. The current sensor system of claim 7, wherein the printed circuit board comprises a T-shape, wherein a first portion of the T-shaped printed circuit board extends through the through hole of each of the plurality of conductors.

9. The current sensor system of claim 8, wherein a second portion of the T-shaped printed circuit board orthogonal to the first portion abuts a major surface of a conductor.

10. The current sensor system of claim 1, wherein the at least two magnetic field sensing elements comprise one or more magnetoresistance elements or Hall effect elements.

11. The current sensor system of claim 1, wherein at least one of the current sensors includes a circuit that is configured to determine a coupling factor indicative of a magnetic coupling between the current sensor and at least one of the plurality of conductors and to use the coupling factors to determine the current in one or more of the plurality of conductors.

12. The current sensor system of claim 1, further comprising one or more additional conductors, each having a first major surface, a second major surface opposite the first major surface, and a through hole extending from the first major surface through a thickness of the conductor to the second major surface, wherein each of the one or more additional conductors is configured to carry a current and wherein the through holes of each of the one or more additional conductors are not aligned with the common reference line.

13. A method for determining a current in one or more of a plurality of conductors, the method comprising:
providing a plurality of current sensors, each current sensor comprising one or more magnetic field sensing elements configured to generate a respective magnetic field signal indicative of a detected magnetic field;
providing a plurality of conductors, each configured to carry a current to be measured and having a through hole extending from a first major surface of the conductor through a thickness of the conductor to a second, opposite major surface of the conductor;
positioning the plurality of conductors relative to each other so that the through hole of each conductor is aligned with a common reference line; and
providing a printed circuit board extending through the through hole of each of the plurality of conductors along the common reference line, wherein each of the plurality of current sensors is mounted on the printed circuit board and positioned at least partially within the through hole of a different respective conductor.

14. The method of claim 13, wherein providing the plurality of current sensors comprises providing each current sensor with at least two magnetic field sensing elements, each configured to generate a respective magnetic field signal indicative of a detected magnetic field and a circuit responsive to the magnetic field signals from the at least two magnetic field sensing elements and configured to generate a current sensor output signal comprising a difference between the magnetic field signals from the at least two magnetic field sensing elements and indicative of the current carried by the respective conductor.

15. The method of claim 13, wherein providing the plurality of conductors comprises providing each conductor in the form of a bus bar.

16. The method of claim 13, wherein providing the plurality of conductors comprises providing the through hole at a position that is offset with respect to a center of a width of the first and second major surfaces.

17. The method of claim 13, wherein providing the printed circuit board comprises providing the printed circuit board with a T-shape, wherein a first portion of the T-shaped printed circuit board extends through the through hole of each of the plurality of conductors and a second portion of the T-shaped printed circuit board orthogonal with respect to the first portion abuts a major of surface of a conductor.

18. The method of claim 13, wherein for each current sensor, characterizing a magnetic coupling between the current sensor and each of the plurality of conductors; and
using the magnetic coupling characterization to determine the current in one or more of the plurality of conductors.

19. The method of claim 18, wherein characterizing the magnetic coupling between the current sensor and each of the plurality of conductors comprises:
determining a coupling factor indicative of a magnetic coupling between the current sensor and each of the plurality of conductors; and
generating a coupling matrix comprising one or more coupling factors for each current sensor.

20. A current sensor system comprising:
a plurality of current sensors, each comprising:
at least two field sensing elements, each configured to generate a respective magnetic field signal indicative of a detected magnetic field; and
a circuit responsive to the magnetic field signals from at least two magnetic field sensing elements and configured to generate a current sensor output signal comprising a difference between the magnetic field signals from the at least two magnetic field sensing elements and indicative of the current carried by the respective conductor; and
means for positioning each of the plurality of current sensors in an through hole of a respective conductor of a plurality of conductors, each conductor having a first major surface, a second major surface opposite the first major surface, and the through hole extending from the first major surface through a thickness of the conductor to the second major surface, wherein each of the plurality of conductors is configured to carry a current and wherein the through holes of each of the plurality of conductors are aligned with a common reference line.

21. The current sensor system of claim 20, wherein the current system positioning means comprises a printed circuit board to which each of the plurality of current sensors is mounted, wherein the printed circuit board extends through the through holes of each of the plurality of conductors.

22. A current sensor system comprising:
- a plurality of conductors, each having a first major surface, a second major surface opposite the first major surface, and an aperture extending from the first major surface through a thickness of the conductor to the second major surface, wherein each of the plurality of conductors is configured to carry a current and wherein the apertures of each of the plurality of conductors are aligned with a common reference line;
- a plurality of current sensors, each positioned at least partially in the aperture of a respective conductor and comprising one or more magnetic field sensing elements; and
- one or more additional conductors, each having a first major surface, a second major surface opposite the first major surface, and an aperture extending from the first major surface through a thickness of the conductor to the second major surface, wherein each of the one or more additional conductors is configured to carry a current and wherein the apertures of each of the one or more additional conductors are not aligned with the common reference line.

23. The current sensor system of claim 22, wherein each of the plurality of conductors comprises a bus bar.

24. The current sensor system of claim 22, wherein each of the plurality of current sensors is mounted on a substrate.

25. The current sensor system of claim 24, wherein the substrate comprises a printed circuit board.

26. The current sensor system of claim 25, wherein each of the plurality of current sensors is mounted on the same printed circuit board.

27. The current sensor system of claim 26, wherein the printed circuit board extends through the aperture of each of the plurality of conductors.

28. The current sensor system of claim 27, wherein the printed circuit board comprises a T-shape, wherein a first portion of the T-shaped printed circuit board extends through the aperture of each of the plurality of conductors.

29. The current sensor system of claim 22, wherein the at least two magnetic field sensing elements comprise one or more magnetoresistance elements or Hall effect elements.

30. The current sensor system of claim 22, wherein at least one of the current sensors includes a circuit that is configured to: determine a coupling factor indicative of a magnetic coupling between the current sensor and at least one of the plurality of conductors, and use the coupling factors to determine the current in one or more of the plurality of conductors.

* * * * *

UNITED STATES PATENT AND TRADEMARK OFFICE
CERTIFICATE OF CORRECTION

PATENT NO. : 11,226,382 B2
APPLICATION NO. : 16/841853
DATED : January 18, 2022
INVENTOR(S) : David Augendre et al.

It is certified that error appears in the above--identified patent and that said Letters Patent is hereby corrected as shown below:

In the Specification

Column 3, Lines 10-11 delete "major of surface" and replace with --major surface--.

Column 4, Line 5 delete "view perspective view" and replace with --perspective view--.

Column 5, Line 20 delete "plurality a" and replace with --plurality of--.

Column 5, Line 34 delete "only the" and replace with --only to the--.

Column 5, Line 36 delete "field" and replace with --fields--.

Column 5, Line 48 delete "field" and replace with --fields--.

Column 7, Line 8 delete "with conductor a" and replace with --with a--.

Column 8, Line 31 delete "sub state" and replace with --substrate--.

Column 9, Line 40 delete "of conductor," and replace with --of conductor 306n--.

Column 9, Line 57 delete "and &" and replace with --and $B_L$--.

Column 10, Line 34 delete "CBYPASS" and replace with --$C_{BYPASS}$--.

Column 10, Lines 66-67 delete "circuit." and replace with --circuit 430.--.

Column 11, Line 27 delete "is" and replace with --are--.

Column 11, Lines 65-66 delete "510a-510N" and replace with --510a, 510N--.

Signed and Sealed this
Fifteenth Day of August, 2023

Katherine Kelly Vidal
*Director of the United States Patent and Trademark Office*

Column 11, Line 66 delete "506a, 506n," and replace with --506a, 506b,--.

Column 12, Line 33 delete "optimized account" and replace with --optimized to account--.

Column 13, Line 35 delete "is sufficiently" and replace with --is sufficiently high--.

Column 13, Line 46 delete "and or" and replace with --and/or--.

Column 14, Line 52 delete "sensors a in" and replace with --sensors in--.

In the Claims

Column 20, Line 42 delete "two field" and replace with --two magnetic field--.

Column 20, Line 53 delete "an through" and replace with --a through--.